(12) United States Patent
Miwa et al.

(10) Patent No.: US 10,410,897 B2
(45) Date of Patent: Sep. 10, 2019

(54) ELECTROSTATIC CHUCK

(71) Applicant: NGK SPARK PLUG CO., LTD., Nagoya-shi, Aichi (JP)

(72) Inventors: Kaname Miwa, Komaki (JP); Shota Saito, Nagoya (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 414 days.

(21) Appl. No.: 15/318,052

(22) PCT Filed: Jun. 17, 2015

(86) PCT No.: PCT/JP2015/067477
§ 371 (c)(1),
(2) Date: Dec. 12, 2016

(87) PCT Pub. No.: WO2015/198942
PCT Pub. Date: Dec. 30, 2015

(65) Prior Publication Data
US 2017/0133258 A1 May 11, 2017

(30) Foreign Application Priority Data
Jun. 23, 2014 (JP) .................................. 2014-128315

(51) Int. Cl.
*H01L 21/683* (2006.01)
*H01L 21/67* (2006.01)
*H01L 21/687* (2006.01)

(52) U.S. Cl.
CPC .... *H01L 21/6833* (2013.01); *H01L 21/67103* (2013.01); *H01L 21/6831* (2013.01); *H01L 21/68757* (2013.01); *H01L 21/68785* (2013.01)

(58) Field of Classification Search
CPC ........... H01L 21/67103; H01L 21/6831; H01L 21/6833; H01L 21/68757; H01L 21/68785
(Continued)

(56) References Cited

U.S. PATENT DOCUMENTS 6,310,755 B1 10/2001 Kholodenko et al.
6,462,928 B1 10/2002 Shamouilian et al.
(Continued)

FOREIGN PATENT DOCUMENTS

JP 10-50811 A 2/1998
JP 2001-102436 A 4/2001
(Continued)

OTHER PUBLICATIONS

Machine translation of Japanese Patent Document Miyata JP H10-50811 A, Feb. 20, 1998 (Year: 1998).*
(Continued)

*Primary Examiner* — Kevin J Comber
(74) *Attorney, Agent, or Firm* — Stites & Harbison, PLLC; Jeffrey A. Haeberlin; James R. Hayne

(57) ABSTRACT

An electrostatic chuck includes an anisotropic heat conductor which is disposed between an attraction substrate and a first heater member, and has an upper surface and a lower surface, and a coefficient of thermal conductivity which varies depending on directions. The anisotropic heat conductor is disposed so that the coefficient of thermal conductivity in a plane direction is larger than the coefficient of thermal conductivity in a thickness direction. Further, the electrostatic chuck includes metal layers which are joined to the anisotropic heat conductor so as to cover the upper surface and the lower surface of the anisotropic heat conductor, and an adhesive layer which is provided on a surface of each metal layer, and joins the metal layer to the attraction substrate or the heater member. Moreover, at least one of the
(Continued)

metal layers is a fused metal layer formed by solidifying a melted metal.

12 Claims, 10 Drawing Sheets

(58) Field of Classification Search
USPC .......................................................... 361/234
See application file for complete search history.

(56) References Cited

U.S. PATENT DOCUMENTS

| | | |
|---|---|---|
| 6,503,368 B1 | 1/2003 | Kholodenko et al. |
| 2002/0036881 A1 | 3/2002 | Shamouilian et al. |
| 2002/0075624 A1 | 6/2002 | Wang et al. |
| 2005/0152089 A1 | 7/2005 | Matsuda et al. |
| 2008/0066676 A1 | 3/2008 | Mariner et al. |
| 2008/0066683 A1 | 3/2008 | Fujimura et al. |
| 2014/0154819 A1 | 6/2014 | Gaff et al. |

FOREIGN PATENT DOCUMENTS

| | | |
|---|---|---|
| JP | 2003-301252 A | 10/2003 |
| JP | 2005-136104 A | 5/2005 |
| JP | 2005-210077 A | 8/2005 |
| JP | 2008-78106 A | 4/2008 |
| JP | 2008-85283 A | 4/2008 |
| JP | 2009-71023 A | 4/2009 |
| JP | 2014-112672 A | 6/2014 |
| JP | 2014-130908 A | 7/2014 |

OTHER PUBLICATIONS

Machine translation of Japanese Patent Document Tani et al. JP 2003-301252 A, Oct. 24, 2003 (Year: 2003).*

Japan Patent Office, International Search Report issued in International Stage Application No. PCT/JP2015/067477, dated Aug. 4, 2015.

* cited by examiner

ELECTROSTATIC CHUCK

CROSS REFERENCE TO RELATED PATENT APPLICATIONS

This international application claims priority to Japanese Patent Application No. 2014-128315 filed Jun. 23, 2014 in the Japanese Patent Office, which is incorporated herein by reference in its entirety.

TECHNICAL FIELD

The present invention relates to an electrostatic chuck used for fixing of a semiconductor wafer, adjustment of flatness of a semiconductor wafer, and the like, for example.

BACKGROUND ART

Conventionally, a semiconductor manufacturing apparatus performs processing such as dry etching (for example, plasma etching) on a semiconductor wafer (for example, silicon wafer). In order to enhance accuracy of the dry etching, the semiconductor wafer needs to be reliably fixed. As fixing means for fixing a semiconductor wafer, an electrostatic chuck which fixes a semiconductor wafer by means of an electrostatic attraction force has been proposed (refer to Patent Document 1, for example).

Specifically, an electrostatic chuck described in Patent Document 1 has an attraction electrode in a ceramic insulating plate, and causes a semiconductor wafer to be attracted to an upper surface (attraction surface) of the ceramic insulating plate by using an electrostatic attraction force generated when a voltage is applied to the attraction electrode. This electrostatic chuck is formed by joining a metal base to a lower surface (joint surface) of the ceramic insulating plate.

In recent years, a technique has been known in which an electrostatic chuck is provided with a function of controlling (heating or cooling) the temperature of a semiconductor wafer in order to suitably perform processing on the semiconductor wafer attracted to an attraction surface.

For example, a technique has been known in which a heater electrode (formed in a spiral shape) is provided as a heating element in a ceramic insulating plate, and the ceramic insulating plate is heated by the heater electrode to heat a semiconductor wafer on an attraction surface.

Furthermore, Patent Document 1 discloses a technique in which a cooling gas flow path that opens at an attraction surface is provided in the ceramic insulating plate, and a cooling gas (e.g., helium gas) that flows in the cooling gas flow path is brought into contact with the semiconductor wafer on the attraction surface to cool the semiconductor wafer.

Besides, in the electrostatic chuck having the above-mentioned structure, since the ceramic insulating plate and the metal base have difference thermal expansion coefficients, when the temperature changes, warpage may occur in the electrostatic chuck due to a thermal stress generated between the ceramic insulating plate and the metal base.

As a countermeasure against such warpage, a technique has been proposed in which a stress reducing layer is provided between the ceramic insulating plate and the metal base (refer to Patent Document 2, for example).

PRIOR ART DOCUMENT

Patent Document

Patent Document 1: Japanese Patent Application Laid-Open (kokai) No. 2005-136104

Patent Document 2: Japanese Patent Application Laid-Open (kokai) No. 2009-71023

SUMMARY OF THE INVENTION

Problem to be Solved by the Invention

The above-mentioned heater electrode is produced by forming a thin spiral or meandering line by screen printing using a material (heat generating material paste) for the heater electrode such as W, for example. In the production process, if the thickness or width of the heater electrode has unevenness or the like, the ceramic insulator contacting the semiconductor wafer also has temperature unevenness (temperature variation in the planar direction), resulting in temperature unevenness also in the semiconductor wafer.

This temperature unevenness in the semiconductor wafer is likely to cause a problem that the degree of processing varies when a pattern is formed on the semiconductor wafer by plasma etching, for example, resulting in a reduction in yield.

In one aspect of the present invention, it is desirable to provide an electrostatic chuck which is able to reduce occurrence of temperature unevenness on the attraction side (first main surface side) of the electrostatic chuck, consequently, occurrence of temperature unevenness in an attraction object attracted to the electrostatic chuck.

Means for Solving the Problem (1) An electrostatic chuck according to one aspect of the present invention includes an attraction substrate, a heater member, an anisotropic heat conductor, metal layers, and adhesive layers, and causes an attraction object to be attracted to a first main surface of the attraction substrate, by using an electrostatic attraction force generated when a voltage is applied to an attraction electrode.

The attraction substrate has the first main surface and a second main surface, and includes the attraction electrode. The heater member is disposed on the second main surface side, and includes a heating element for heating the attraction substrate. The anisotropic heat conductor has an upper surface and a lower surface. The coefficient of thermal conductivity of the anisotropic heat conductor varies depending on directions. The anisotropic heat conductor is disposed between the attraction substrate and the heater member so that the coefficient of thermal conductivity in a plane direction is larger than the coefficient of thermal conductivity in a thickness direction. The metal layers are joined to the anisotropic heat conductor so as to cover the upper surface and the lower surface of the anisotropic heat conductor, respectively. Each adhesive layer is disposed on the surface of each respective metal layer, and joins the metal layer to the attraction substrate or the heater member. At least one of the metal layers is a fused metal layer formed by solidifying a melted metal.

That is, the electrostatic chuck includes, between the attraction substrate and the heater member, the anisotropic heat conductor, the coefficient of thermal conductivity of which varies depending on directions, specifically, the anisotropic heat conductor configured such that the coefficient of thermal conductivity in the plane direction is larger than the coefficient of thermal conductivity in the thickness direction.

The upper surface and the lower surface indicate one surface and the other surface, in the thickness direction, of the anisotropic heat conductor. The plane direction is a direction perpendicular to the thickness direction, that is, a planar direction in which the anisotropic heat conductor spreads. The anisotropic heat conductor has a predetermined thickness between the upper surface and the lower surface, and the thickness direction is a direction along this thickness (the same applies hereinafter).

Therefore, even when the heating state is uneven (depending on the position of the heating element) due to the structure, arrangement, or the like of heating element provided in the heater member, the anisotropic heat conductor allows heat to be transferred easier in the plane direction than in the thickness direction, whereby temperature unevenness in the plane direction is reduced. Thus, temperature unevenness in the attraction substrate (i.e., temperature unevenness at the substrate surface in the plane direction) can be reduced. In other words, the temperature at the substrate surface in the plane direction can be made uniform.

Accordingly, temperature unevenness in the attraction object such as a semiconductor wafer attracted to the attraction substrate can be reduced. Thus, it is possible to reduce occurrence of a problem such as variation in the degree of processing in forming a pattern on a semiconductor wafer by plasma etching, for example. As a result, the yield can be improved.

The reason why temperature unevenness is reduced by the anisotropic heat conductor is considered as follows. In the anisotropic heat conductor, the temperature is not likely to be transferred in the thickness direction. Therefore, even if the heater has temperature unevenness, the temperature caused by the heater is first transferred in the plane direction perpendicular to the thickness direction (plane direction similar to the substrate surface), and the temperature is made uniform inside the anisotropic heat conductor, and then the uniform temperature is transferred to the attraction substrate side.

According to the research of the present inventors, a difference in coefficient of thermal conductivity between the thickness direction and the plane direction is desired to be, for example, 100 times or more, for suitable reduction in temperature unevenness.

Further, the electrostatic chuck includes the metal layers joined to the anisotropic heat conductor so as to cover the upper surface and the lower surface of the anisotropic heat conductor, and an adhesive layer which contributes to joining with the attraction substrate or the heater member is provided on a surface of each of the metal layers, and an adhesive layer disposed on the surface of each metal layer, which joins the metal layer to the attraction substrate or the heater member. Further, at least one of the metal layers is a fused metal layer formed by solidifying a melted metal.

That is, one metal layer is formed on the upper surface of the anisotropic heat conductor, one adhesive layer is formed on the surface of the one metal layer, and the attraction substrate is disposed on the one surface side (attraction side: e.g., front side). Likewise, the other metal layer is formed on the lower surface of the anisotropic heat conductor, the other adhesive layer is formed on the surface of the other metal layer, and the heater member is disposed on the other surface side (opposite side from the attraction side: e.g., rear side).

For example, an anisotropic heat conductor formed of graphite (e.g., a graphite sheet) usually has poor wettability with an adhesive. Therefore, it is not easy to join the anisotropic heat conductor to a member (attraction substrate or heater member) in the stacking direction (i.e., in the thickness direction of the anisotropic heat conductor) by using an adhesive.

In contrast, in this electrostatic chuck, the metal layers having higher joining performance with an adhesive than the anisotropic heat conductor are formed on the upper surface and the lower surface of the anisotropic heat conductor, joining performance with the adhesive layer is improved. Thus, the electrostatic chuck is advantageous in that the joining performance between the anisotropic heat conductor and the adhesive layer (consequently, the attraction substrate or the heater member) is high.

Moreover, in this electrostatic chuck, at least one of the both metal layers is a fused metal layer formed by solidifying a melted metal.

Since the fused metal layer is formed by applying a melted metal to the anisotropic heat conductor by coating or the like and then solidifying the melted metal, the fused metal layer is closely and firmly joined to the anisotropic heat conductor. For example, when there are gaps in the anisotropic heat conductor such as graphite, the melted metal enters the gaps to be firmly joined to the anisotropic heat conductor.

Since the fused metal layer firmly adheres to the anisotropic heat conductor to provide high joining performance, heat is easily transferred from the anisotropic heat conductor to the fused metal layer, and moreover, heat is easily transferred in the fused metal layer in the plane direction. Also in this point of view, temperature unevenness in the attraction substrate can be significantly reduced. That is, the temperature at the substrate surface in the plane direction can be made uniform.

Further, when the fused metal layer is formed by coating or the like, the thickness thereof can be easily adjusted (i.e., can be easily increased). Accordingly, when the thickness is increased, the metal layer having high thermal conductivity and the sufficient thickness spreads in the plane direction, whereby temperature unevenness in the attraction substrate can be reduced more significantly. That is, the temperature at the substrate surface in the plane direction can be made more uniform.

Further, since this fused metal layer firmly adheres to the anisotropic heat conductor, joining performance is high, and separation is less likely to occur between the fused metal layer and the anisotropic heat conductor.

The thickness of the fused metal layer is preferably in a range from 50 µm to 300 µm, for example, which allows the fused metal layer to be firmly joined to the anisotropic heat conductor with less separation, and moreover, ensures high thermal conductivity.

(2) The above-mentioned electrostatic chuck may include a fused metal layer formed by solidifying a melted metal, which fused metal layer covers a side surface located between the upper surface and the lower surface of the anisotropic heat conductor.

For example, when the anisotropic heat conductor has a structure in which many thin films are stacked (in the stacking direction) like the structure of graphite, separation of the anisotropic heat conductor is likely to occur from an end surface (side surface) in the plane direction.

In contrast, in this electrostatic chuck, since the side surface of the anisotropic heat conductor is covered with the fused metal layer, separation of the anisotropic heat conductor is less likely to occur.

If the fused metal layer is continuously formed from the side surface of the anisotropic heat conductor to reach the upper surface or the lower surface (preferably, both surfaces), separation of the anisotropic heat conductor hardly occurs.

In particular, when the fused metal layer is formed so as to cover the entire surface of the anisotropic heat conductor, separation between the anisotropic heat conductor and the fused metal layer more hardly occurs.

(3) In the above-mentioned electrostatic chuck, the fused metal layer may be a sprayed metal layer formed by metal spraying.

This electrostatic chuck exemplifies a method for forming a fused metal layer.

In addition to metal spraying, for example, a method of immersing an anisotropic heat conductor in a melted metal may be adopted.

(4) The above-mentioned electrostatic chuck may include another heater member having another heating element for heating the attraction substrate, between the attraction substrate and the adhesive layer on the upper surface side of the anisotropic heat conductor. The another heating element of the another heater member may be configured to include a plurality of heating elements separately disposed at different positions in the plane direction so that the temperature of the attraction substrate can be controlled to different temperatures depending on the positions in the plane direction.

In the above-mentioned electrostatic chuck, the temperature of the attraction substrate (consequently, the attraction object member) in the plane direction can be made uniform. However, depending on the content of processing on the attraction object member, the temperature of the attraction substrate (consequently, the attraction object member) in the plane direction might be desired to be arbitrarily controlled depending on positions.

So, in this electrostatic chuck, the another heating element is composed of a plurality of heating elements separately disposed at different positions in the plane direction so that the temperature of the attraction substrate can be controlled to different temperatures depending on the positions in the plane direction. By controlling the temperatures of the plurality of heating elements to desired temperatures, the temperature of the attraction substrate can be controlled to different temperatures depending on the positions in the plane direction. Further, a difference in temperature can be estimated based on the amount of power to each another heating element.

That is, by controlling the temperatures of the separated other heating elements, the temperature of the attraction object member can be easily controlled to desired temperatures depending on the positions in the plane direction.

(5) An electrostatic chuck according to another aspect of the present invention includes an attraction substrate, a heater member, an anisotropic heat conductor, and another heater member different from the above-mentioned heater member, and causes an attraction object to be attracted to a first main surface of the attraction substrate, by using an electrostatic attraction force generated when a voltage is applied to an attraction electrode.

The attraction substrate has the first main surface and a second main surface, and includes the attraction electrode. The heater member is disposed on the second main surface side, and includes a heating element for heating the attraction substrate. The anisotropic heat conductor has an upper surface and a lower surface. The coefficient of thermal conductivity of the anisotropic heat conductor varies depending on directions. The anisotropic heat conductor is disposed between the attraction substrate and the heater member so that the coefficient of thermal conductivity in the plane direction is larger than the coefficient of thermal conductivity in the thickness direction. The another heater member is disposed between the attraction substrate and the anisotropic heat conductor, and includes another heating element for heating the attraction substrate. The another heating element is configured to include a plurality of heating elements separately disposed at different positions in the plane direction so that the temperature of the attraction substrate can be controlled to different temperatures depending on the positions in the plane direction.

This electrostatic chuck, like the electrostatic chuck according to one aspect, includes, between the attraction substrate and the heater member, the anisotropic heat conductor, the coefficient of thermal conductivity of which varies depending on directions, specifically, the anisotropic heat conductor configured such that the coefficient of thermal conductivity in the plane direction is larger than the coefficient of thermal conductivity in the thickness direction.

Accordingly, even when the heating state is uneven (depending on the position of the heating element) due to the structure, arrangement, or the like of the heating element provided in the heater member, the anisotropic heat conductor allows heat to be transferred easier in the plane direction than in the thickness direction, whereby temperature unevenness in the plane direction is reduced.

Thus, temperature unevenness in the attraction substrate (i.e., temperature unevenness at the substrate surface in the plane direction) can be reduced. In other words, the temperature at the substrate surface in the plane direction can be made uniform.

Accordingly, temperature unevenness in the attraction object such as a semiconductor wafer attracted to the attraction substrate can be reduced. Thus, it is possible to reduce occurrence of a problem such as variation in the degree of processing in forming a pattern on a semiconductor wafer by plasma etching, for example. As a result, when processing an attraction object member, the yield can be improved.

Further, in this electrostatic chuck, the another heating element is configured to include a plurality of heating elements separately disposed at different positions in the plane direction so that the temperature of the attraction substrate can be controlled to different temperatures depending on the positions in the plane direction. Therefore, by controlling the temperatures of the plurality of heating elements to desired temperatures, the temperature of the attraction substrate can be controlled to different temperatures depending on the positions in the plane direction.

That is, when there is a demand (challenge) to control the temperature of the attraction substrate (consequently, the attraction object member) in the plane direction to be varied depending on positions, the temperature of the attraction object member can be easily controlled to desired different temperatures in the plane direction by controlling the temperatures of the separated heating elements as in this electrostatic chuck.

(6) The above-mentioned electrostatic chuck may include metal layers joined to the anisotropic heat conductor so as to cover the upper surface and the lower surface of the anisotropic heat conductor, and may include an adhesive layer which is disposed on the surface of each metal layer and joins the metal layer to the heater member or the another heater member.

Each metal layer has high joining performance with the adhesive layer, thereby realizing high joining performance between the anisotropic heat conductor and each heater member.

(7) In the above-mentioned electrostatic chuck, the heating element of the heater member is configured to include a plurality of heating elements separately disposed at different positions in the plane direction, and the number of the heating elements separately disposed in the another heating element may be larger than the number of the heating elements separately disposed in the heating element.

In this electrostatic chuck, not only the another heating element but also the heating element may be configured to include a plurality of heating elements separately disposed at different positions in the plane direction.

Accordingly, the temperature of the attraction substrate can be controlled to desired temperatures by controlling the temperatures of the multiple heating elements not only in the another heating element but also in the heating element to desired temperatures, respectively.

That is, by controlling the temperatures of the respective separated heating elements in the another heating element as well as in the heating element, the temperature of the attraction object member can be controlled to be the desired temperature more easily.

(8) In the above-mentioned electrostatic chuck, each heater member, except each heating element, may be formed of ceramic or polyimide as a main component.

This electrostatic chuck exemplifies the structures of the heater member and the another heater member.

That is, as a material of an insulating part of the heater member or the another heater member, for example, a ceramic material or polyimide (polyimide resin) similar to that of the attraction substrate may be adopted.

Specifically, ceramic or polyimide may be used as a material forming the periphery of each heating element of the heater member or a material forming the periphery of each another heating element of the another heater member.

Here, each heater member indicates the heater member and the another heater member, and each heating element indicates the heating element and the another heating element.

(9) In the above-mentioned electrostatic chuck, the anisotropic heat conductor may be formed of graphite.

This electrostatic chuck exemplifies the material of the anisotropic heat conductor.

Besides graphite, for example, polyimide resin or the like may be adopted.

Hereinafter, structures adoptable as the above-mentioned structures will be described.

As an electrostatic chuck, a structure may be adopted in which a disk-like anisotropic heat conductor, disk-like heater members, and a disk-like metal base are disposed on a second main surface side of an attraction substrate, and are adhered to each other by means of adhesive layers.

Various types of other members (members other than the anisotropic heat conductor) may be disposed between the attraction substrate and the anisotropic heat conductor, or between the anisotropic heat conductor and each heater member.

As a main material (an insulating material other than a conductive portion) forming the attraction substrate, the above-mentioned ceramic may be adopted. When the attraction substrate is formed of ceramic, a plurality of ceramic layers may be stacked. In this case, various types of components can be easily formed inside the attraction substrate.

As the ceramic material, a sintered body containing, as a main component, high temperature fired ceramic formed of alumina, yttria (yttrium oxide), aluminum nitride, boron nitride, silicon carbide, silicon nitride, or the like may be adopted.

Depending on purposes, a sintered body containing, as a main component, low temperature fired ceramic such as glass ceramic obtained by adding an inorganic ceramic filler such as alumina to borosilicate-based glass or lead borosilicate-based glass, may be adopted. Alternatively, a sintered body containing, as a main component, dielectric ceramic formed of barium titanate, lead titanate, strontium titanate, or the like may be adopted.

In processes such as dry etching for manufacturing a semiconductor, various techniques using plasma are employed. In a process using plasma, corrosive gas such as halogen gas is often used. Therefore, the electrostatic chuck exposed to plasma or corrosive gas requires a high corrosion resistance. Therefore, the attraction substrate may be formed of a material having corrosion resistance against corrosive gas and plasma, e.g., a material containing alumina or yttria as a main component.

The materials for conductors forming the attraction electrode and the heater are not particularly limited. However, in the case where these conductors and ceramic part are formed by a co-firing method, metal powder in the conductors needs to have a higher melting point than the firing temperature for a ceramic insulating plate. For example, in the case where the ceramic part is formed of so-called high temperature fired ceramic (e.g., alumina), as the metal powder in the conductors, nickel (Ni), tungsten (W), molybdenum (Mo), manganese (Mn), an alloy thereof, or the like may be adopted.

In the case where the ceramic part is formed of so-called low temperature fired ceramic (e.g., glass-ceramic or the like), as the metal powder in the conductors, copper (Cu), silver (Ag), or an alloy thereof may be adopted.

In the case where the ceramic part is formed of high dielectric constant ceramic (e.g., barium titanate or the like), as the metal powder in the conductors, nickel (Ni), copper (Cu), silver (Ag), palladium (Pd), platinum (Pt), an alloy thereof, or the like may be adopted.

The attraction electrode and the heater may be formed by, using a conductive paste containing metal powder, applying the conductive paste by a conventional known method, e.g., screen printing, and then sintering the conductor paste.

As the attraction object, a semiconductor wafer, a glass substrate, or the like may be adopted.

As the material for the fused metal layer, aluminum (Al) or an alloy containing aluminum may be adopted. Specifically, an alloy of aluminum and zinc (Zn) may be adopted, for example. As a method for forming the fused metal layer, metal spraying or the like may be adopted.

The fused metal layer formed by metal spraying usually has a structure (lamella structure) composed of flattened particles, as viewed in a cross section taken along the thickness direction of the layer. That is, this fused metal layer usually has a structure composed of disk-like or layer-like particles called lamellae.

When the metal layer is not a fused metal layer, the metal layer may be a plated metal layer. As a material for the plated metal layer, a simple substance of nickel (Ni), gold (Au) or the like, or an alloy thereof may be adopted. As a plating method for forming the plated metal layer, well-known electroless plating or the like may be adopted.

Alternatively, when the metal layer is not a fused metal layer, the metal layer may be formed by, for example, AD (aerosol deposition), cold spraying, or the like.

In a metal layer formed by the above-mentioned plating, AD (aerosol deposition), or cold spraying, usually, the above-mentioned lamella structure is not often seen.

As the material forming the adhesive layer, for example, a resin material such as silicone resin, acrylic resin, epoxy resin, polyimide resin, polyamide-imide resin, or polyamide resin, or a metal material such as indium may be adopted.

In particular, as the material forming the adhesive layer, for example, adhesives of various resin adhesive agents having heat resistance to 100° C. or more may be selected. Alternatively, the material forming the adhesive layer may have lower thermal conductivity than ceramic. In this case, performance for suppressing temperature unevenness is improved.

Since the difference in thermal expansion coefficient between the ceramic material and the metal base is great, the adhesive layer may be formed of an elastically deformable (flexible) resin material having a function as a buffer material.

That is, the adhesive layer may have thermal expansion coefficient and flexibility intermediate between those of ceramic and the anisotropic heat conductor.

In this case, the adhesive layer is more flexible than ceramic and the anisotropic heat conductor, a thermal stress applied between the members adjacent to the adhesive layer can be reduced. Thus, deformation (warpage) of the electrostatic chuck due to the thermal stress can be suppressed.

The flexibility means softness (bendability) when an external force is applied, and can be indicated by a Young's modulus, for example. That is, the adhesive layer is lower in Young's modulus than ceramic and the anisotropic heat conductor.

As the material for the metal base, copper (Cu), aluminum (Al), iron (Fe), titanium (Ti), or the like may be adopted.

Figure 1:
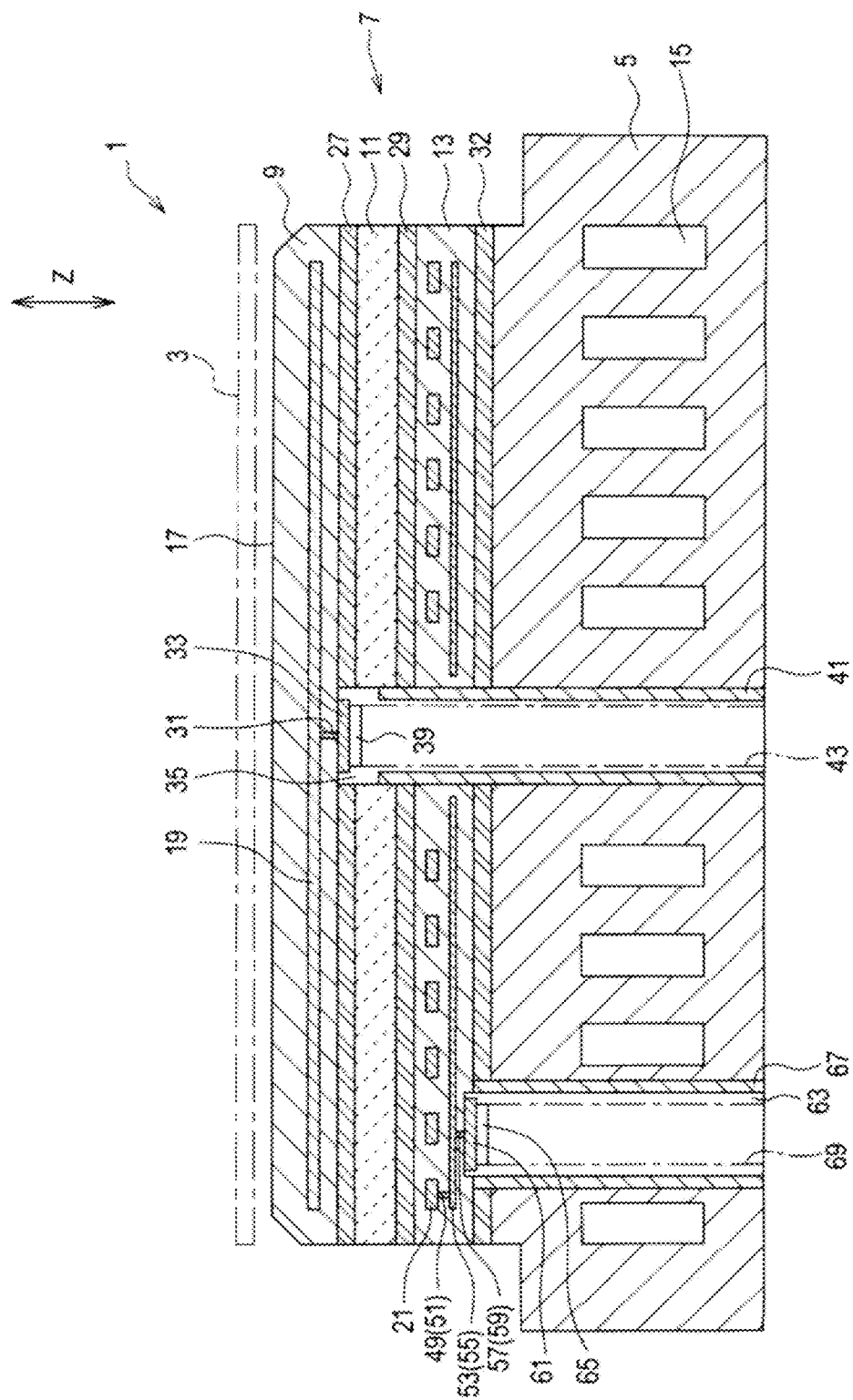
FIG. 1 Explanatory view schematically illustrating an electrostatic chuck according to Embodiment 1 cut along the thickness direction thereof.

DESCRIPTION OF REFERENCE NUMERALS 1, 81 . . . electrostatic chuck
3 . . . semiconductor wafer
5, 85 . . . metal base
7, 83 . . . attraction member
9, 87 . . . attraction substrate
11, 89 . . . graphite sheet
13, 91 . . . first heater member (heater member)
17 . . . attraction surface
19, 95 . . . attraction electrode
21, 111 . . . first heating element (heating element)
23, 25, 71, 73, 101, 103 . . . fused metal layer (metal layer)
27, 29, 32, 105, 107, 109 . . . adhesive layer
75 . . . plated metal layer (metal layer)
93 . . . second heater member (another heater member)
97 . . . second heating element (another heating element)

MODES FOR CARRYING OUT THE INVENTION

Hereinafter, modes (embodiments) for carrying out the present invention will be described.
Embodiment 1

In this embodiment, an electrostatic chuck capable of attracting and holding, for example, a semiconductor wafer is exemplified.

a) First, the structure of the electrostatic chuck according to Embodiment 1 will be described.

As schematically shown in FIG. 1, the electrostatic chuck 1 according to Embodiment 1 is a device for attracting a semiconductor wafer 3 at its front side (attraction side: upper side in FIG. 1). This electrostatic chuck 1 is obtained by adhering a disk-like attraction member 7 having, for example, a diameter of 300 mm and a thickness of 3 mm for attracting the semiconductor wafer 3, onto one side (upper side in FIG. 1), in the thickness direction, of a disk-like metal base (cooling plate) 5 having, for example, a diameter of 340 mm and a thickness of 20 mm.

The thickness direction is the up-down direction in FIG. 1 (stacking direction: Z direction), and a direction perpendicular to the thickness direction is a direction (plane direction: planar direction) in which the electrostatic chuck 1 spreads in a plane.

In Embodiment 1, as described later in detail, the attraction member 7 is formed by stacking plate-shaped members such as a disk-like attraction substrate 9, a disk-like graphite sheet 11 which is an anisotropic heat conductor, and a disk-like first heater member 13.

Inside the electrostatic chuck 1, as is well known, a cooling gas supply path which is a tunnel for supplying a cooling gas such as helium for cooling the semiconductor wafer 3, and an opening at which the cooling gas supply path opens in the thickness direction of the electrostatic chuck 1, are provided. However, these elements are not shown in FIG. 1 (the same applies hereinafter).

Each of the attraction substrate 9 and the heater member (hereinafter referred to as a first heater member) 13 is obtained by stacking, mainly, a plurality of ceramic layers described later, and (an insulating portion thereof) is an alumina sintered body containing alumina as a main component.

Meanwhile, the metal base 5 is formed of a metal such as aluminum or an aluminum alloy. Inside the metal base 5, a cooling space 15 filled with cooling liquid (e.g., fluorinated liquid or pure water) for cooling the attraction member 7 is disposed.

Figure 2:
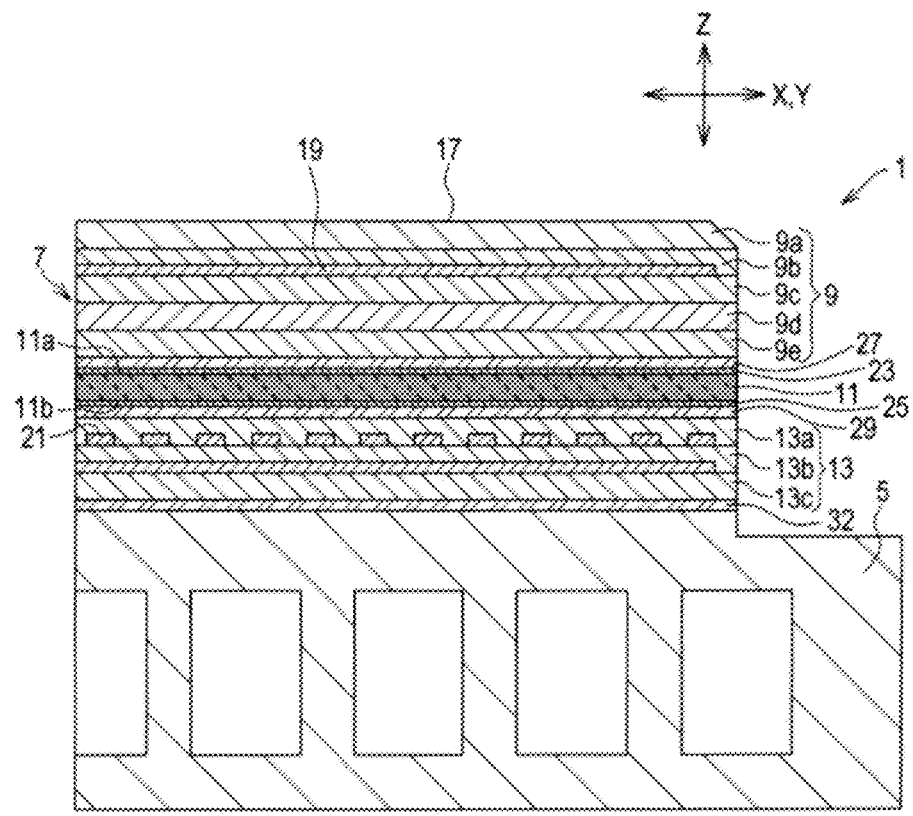
FIG. 2 Explanatory enlarged view illustrating a part of the electrostatic chuck according to Embodiment 1 cut along the thickness direction thereof.

As specifically shown in FIG. 2, the attraction substrate 9 is composed of stacked five, i.e., first to fifth, ceramic layers 9a, 9b, 9c, 9d and 9e, and the first heater member 13 is composed of stacked three, i.e., sixth to eighth, ceramic layers 13a, 13b and 13c. In FIG. 2, an upper surface of the attraction substrate 9 is a first main surface (attraction surface 17), and a lower surface thereof is a second main surface.

The structure of the attraction substrate 9 is fundamentally identical to the conventional structure, except that an attraction electrode 19 is disposed beneath the attraction surface 17 (FIG. 2) so as to spread in the planar direction, in the attraction substrate 9. The attraction electrode 19 is formed between the second and third ceramic layers 9b and 9c.

When the electrostatic chuck 1 is used, a high DC voltage is applied to the attraction electrode 19, whereby the attraction electrode 19 generates an electrostatic attraction force (attraction force) for attracting the semiconductor wafer 3. Using this attraction force, the semiconductor wafer 3 is attracted and fixed to the electrostatic chuck 1.

Inside the first heater member 13, a heating element (hereinafter referred to as a first heating element) 21 is disposed so as to spread in the planar direction. The first heating element 21 is formed between the sixth and seventh ceramic layers 13a and 13b.

The attraction electrode 19 and the first heating element 21 are formed of tungsten, for example.

In Embodiment 1, the graphite sheet 11 as an anisotropic heat conductor is disposed in layers between the attraction substrate 9 and the first heater member 13.

On an upper surface 11a and a lower surface 11b (both surfaces) of the graphite sheet 11 in the thickness direction (Z direction), metal layers 23 and 25 are formed so as to cover the entire surfaces of the graphite sheet 11. The metal layers 23 and 25 are made of, for example, aluminum and are joined to the graphite sheet 11. The upper surface 11a and the lower surface 11b are parallel to each other.

The metal layers 23 and 25 are fused metal layers formed by solidifying melted aluminum, for example. Specifically, the metal layers 23 and 25 are sprayed metal layers formed by metal spraying. The thickness of each of the metal layers (hereinafter referred to as fused metal layers) 23 and 25 is, for example, 200 μm within a range from 50 μm to 300 μm.

Further, an adhesive layer 27 formed of, for example, silicone resin is disposed between the attraction substrate 9 and the upper fused metal layer 23, and a similar adhesive layer 29 is also disposed between the lower fused metal layer 25 and the first heater member 13.

A similar adhesive layer 32 is also disposed between the first heater member 13 and the metal base 5.

With these adhesive layers 27, 29, 32, the attraction substrate 9, the graphite sheet 11, the first heater member 13, and the metal base 5 are joined together.

The silicone resin forming the adhesive layers 27 to 31 has a higher flexibility than alumina and graphite, and a smaller Young's modulus than alumina and graphite.

Figure 3:
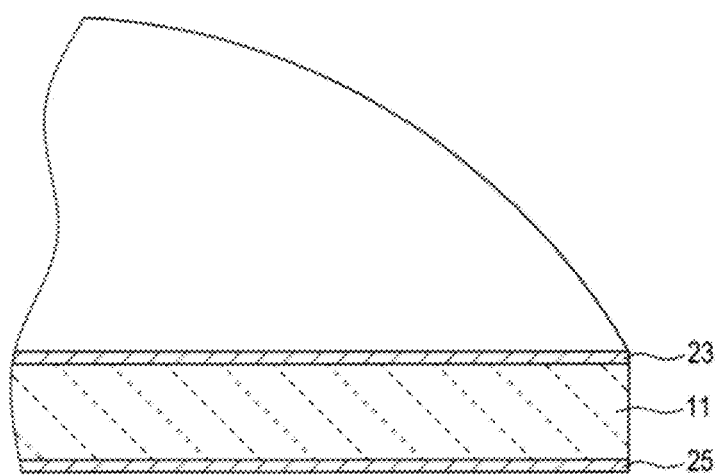
FIG. 3 Perspective view illustrating a part of a graphite sheet and the like cut along the thickness direction thereof.

The graphite sheet 11, a part of which is shown in FIG. 3, is a disk-like member having, for example, a diameter of 300 mm and a thickness of 1 mm.

Figure 4:
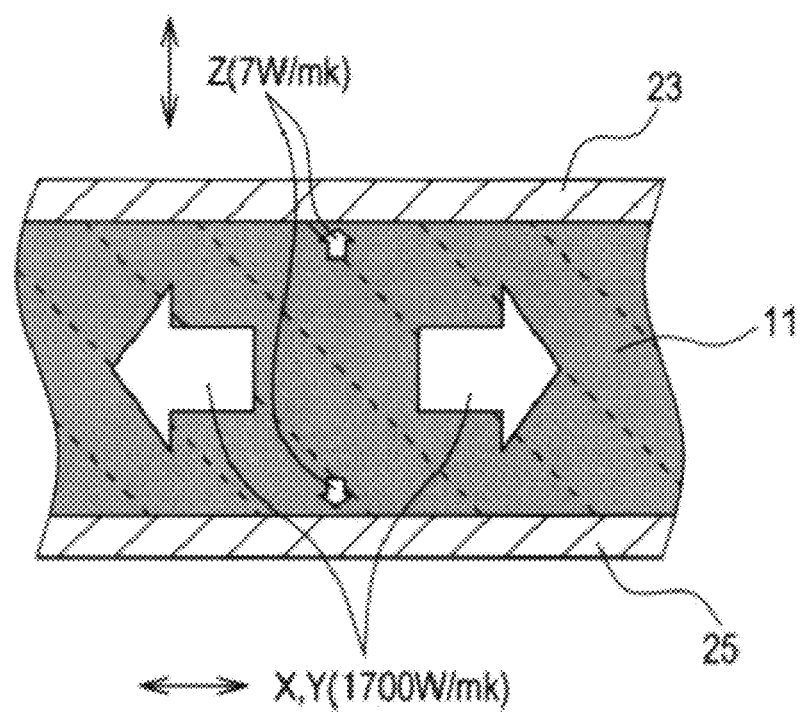
FIG. 4 Explanatory view illustrating the graphite sheet and the like cut along the thickness direction thereof, in which a difference in coefficient of thermal conductivity between respective directions is shown.

This graphite sheet 11 is an anisotropic heat conductor, the coefficient of thermal conductivity of which varies depending on directions. In Embodiment 1, as shown in FIG. 4, the graphite sheet 11 has a property that the coefficient of thermal conductivity is larger in the (plane) direction (left-right direction in FIG. 4: planar direction) perpendicular to the stacking (thickness) direction than in the stacking (thickness) direction (up-down direction in FIG. 4).

Specifically, the coefficient of thermal conductivity in the stacking direction (Z direction) is 7 W/mK, and the coefficient of thermal conductivity in the perpendicular direction (planar direction: direction of the XY plane) to the stacking direction is 1700 W/mK. The difference between the coefficients of thermal conductivity is 240 times or more. The X direction in the XY plane is the left-right direction in FIG. 5A, and the Y direction is the up-down direction (direction perpendicular to the X direction) in FIG. 5A.

b) Next, the electric components of the electrostatic chuck 1 according to Embodiment 1 will be described.

[Attraction Electrode 19]

Figure 5A:
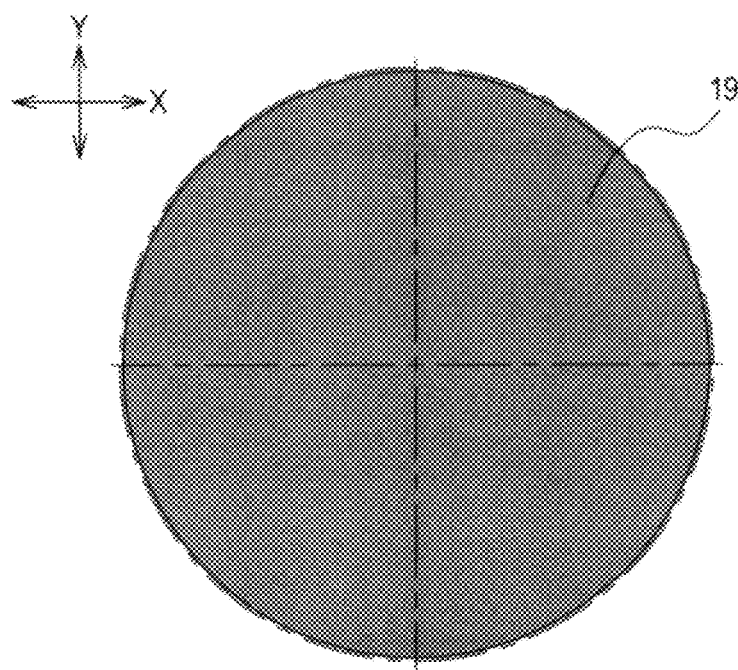
FIGS. 5A to 5B Plan view illustrating an attraction electrode (FIG. 5A), and plan view illustrating a via connected to the attraction electrode (FIG. 5B).
Figure 5B:
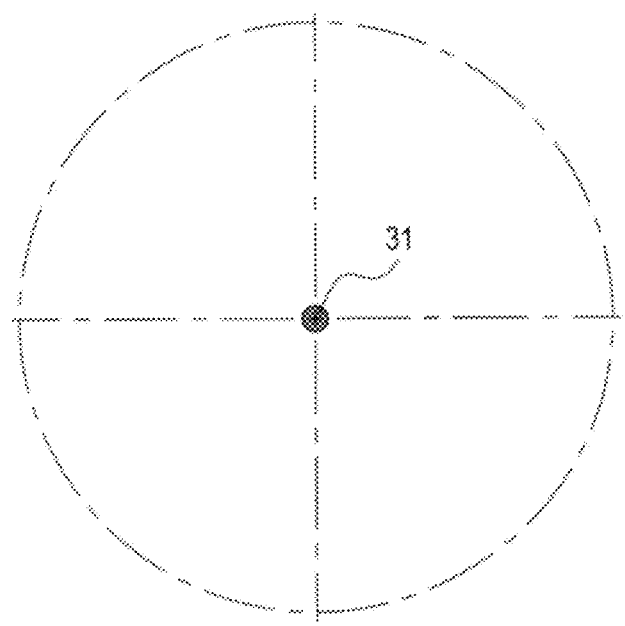

As shown in FIGS. 5A to 5B, the attraction electrode 19 has a circular shape in a plan view. The "plan view" shows the state as viewed in the stacking direction (Z direction) (the same applies hereinafter).

An attraction conductive part (via) 31 is disposed on the rear side of the attraction electrode 19 (lower side in FIG. 1), coaxially with the central axis of the attraction electrode 19.

The attraction electrode 19 is connected to a metallization layer 33 through the via 31 as shown in FIG. 1. The metallization layer 33 is exposed at a surface of an inner hole 35 extending in the stacking direction from the surface of the electrostatic chuck 1 on the rear side.

An internal connection terminal 39 is disposed on the metallization layer 33, and a cylindrical insulating member 41 is coaxially fitted into the inner hole 35. A terminal metal fitting 43 is attached to the internal connection terminal 39, and power for generating an electrostatic attraction force is supplied.

[First Heater Member 13]

Figure 6A:
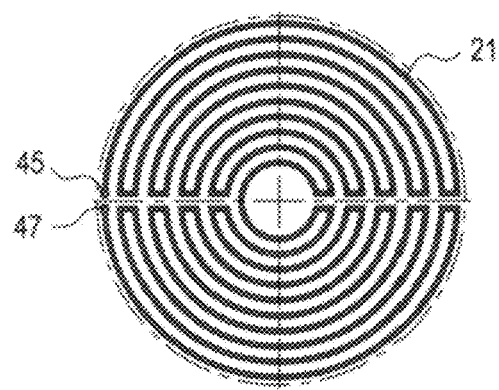
FIGS. 6A to 6D Plan view illustrating a first heating element as a part of a first heater member (FIG. 6A), plan view illustrating a via connected to the first heating element (FIG. 6B), plan view illustrating internal conductive layers (FIG. 6C), and plan view illustrating vias connected to the internal conductive layers (FIG. 6D).

As shown in FIG. 6A, the first heating element 21 of the first heater member 13 is formed so as to be folded back many times and surround the central axis in the same plane.

Figure 6B:
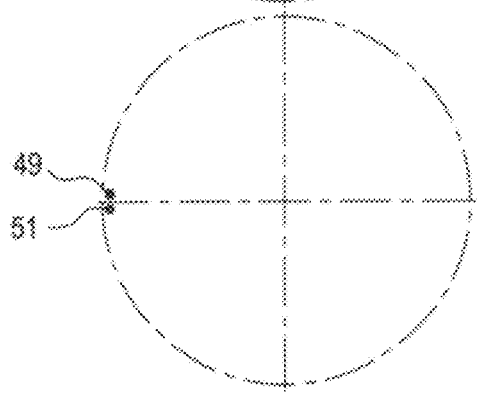

As shown in FIG. 6B, on the rear side of the first heating element 21 (lower side in FIG. 1), a pair of vias 49 and 51 are disposed to be connected to a pair of terminal portions 45 and 47 of the first heating element 21, respectively.

Figure 6C:
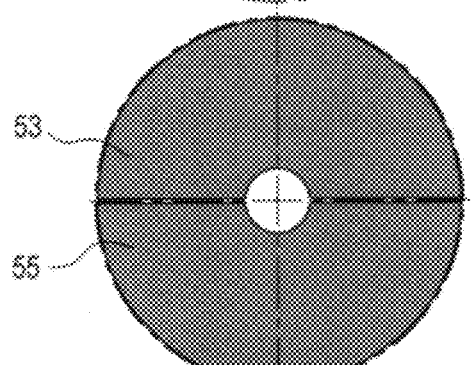

As shown in FIG. 6C, on the rear side of the pair of the vias 49 and 51, a pair of internal conductive layers (drivers) 53 and 55, each having a substantially semicircular shape in a plan view, are disposed to be connected to the pair of the vias 49 and 51, respectively.

Figure 6D:
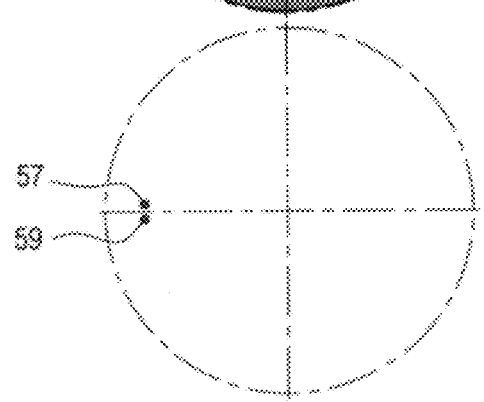

As shown in FIG. 6D, on the rear side of the pair of the internal conductive layers 53 and 55, a pair of vias 57 and 59 are disposed to be connected to the pair of the internal conductive layers 53 and 55, respectively.

As shown in FIG. 1, the pair of the vias 57 and 59 are each connected to the metallization layer 61 (in FIG. 1, only one of the vias is shown). The metallization layer 61 is exposed at a surface of the inner hole 63 extending in the stacking direction from the surface of the electrostatic chuck 1 on the rear side.

An internal connection terminal 65 is disposed on the metallization layer 61. Further, a cylindrical insulating member 67 is coaxially fitted into the inner hole 63. A terminal metal fitting 69 is attached to the internal connection terminal 65, and power for heating the first heating element 21 is supplied.

A power supply circuit (not shown) is connected to the attraction electrode 19 of the electrostatic chuck 1 and the first heating element 21 of the first heater member 13, in order to supply power for activating the attraction electrode 19 and the first heating element 21 through the above-mentioned electric structure.

c) Next, a method of manufacturing the electrostatic chuck 1 according to Embodiment 1 will be briefly described.

(1) Although not shown, as a raw material, powder of $Al_2O_3$ (92% by weight) as a main component, powder of MgO (1% by weight), powder of CaO (1% by weight), and powder of $SiO_2$ (6% by weight) are mixed, and wet-milled with a ball mill for 50 to 80 hours, and thereafter dehydrated and dried.

(2) Then, to the resultant powder, methacrylic acid isobutyl ester (3% by weight), butyl ester (3% by weight), nitrocellulose (1% by weight), and dioctylphthalate (0.5% by weight) are added, and further, trichlor-ethylene and n-butanol are added as solvents, followed by mixing with a ball mill to provide slurry having fluidity.

(3) Then, this slurry is vacuum-degassed, and thereafter is outpoured in a plate shape for gradual cooling to cause the solvents to evaporate, thereby forming first to eighth alumina green sheets (corresponding to the first to eighth ceramic layers 9a to 9e and 13a to 13c).

Then, spaces and via-holes to be cooling gas flow paths such as the cooling gas supply path, spaces to be the inner holes 35 and 63, and through-holes to be the vias 31, 49, 51, 57 and 59 are formed at required positions in all or some of the first to eighth alumina green sheets.

(4) Further, tungsten powder is mixed into the raw powder for the alumina green sheets, and the resultant powder is processed in a similar manner to that mentioned above to provide slurry to be used as a metalizing ink.

(5) Then, in order to form the attraction electrode 19, the first heating element 21, and the internal conductive layers 53 and 55, patterns thereof are printed, by using the metalizing ink in ordinary screen printing, on the alumina green sheets at positions where the attraction electrode 19, the first heating element 21, and the internal conductive layers 53 and 55 are to be formed. In order to form the vias 31, 49, 51, 57 and 59, the through-holes are filled with the metalizing ink.

(6) Next, the first to fifth alumina green sheets are aligned with each other so as to form the cooling gas flow paths and the like, and are bonded by thermo-compression, thereby forming a first lamination sheet (for the attraction substrate). Likewise, the sixth to eighth alumina green sheets are aligned with each other so as to form the cooling gas flow paths and the like, and are bonded by thermo-compression, thereby forming a second lamination sheet (for the first heater member).

(7) Next, the first and second lamination sheets obtained by thermo-compression bonding are cut into a predetermined disk shape (e.g., a disk shape with a diameter of 8 inches).

(8) Next, in reducing atmosphere, the cut first and second lamination sheets are fired (regular firing) for five hours at a temperature in a range from 1400° C. to 1600° C. (e.g., 1450° C.), thereby forming first and second alumina sintered bodies.

(9) Next, the metallization layers 33 and 61 and the internal connection terminals 39 and 65 are formed at required positions in the first and second alumina sintered bodies.

(10) Besides, the both sides (in the thickness direction) of the graphite sheet 11 are subjected to metal spraying using melted aluminum, thereby forming fused metal layers 23 and 25 made of aluminum, each having a thickness of 200 µm, for example.

This metal spraying is a technique of heating and melting, for example, aluminum by using, for example, electric or fuel energy, and microising the melted aluminum by using compressed air or the like, and then spraying the micronized aluminum to form a coating.

The fused metal layers 23 and 25 thus formed each have a structure composed of flattened particles, as viewed in a cross section cut along the thickness direction of the layer. That is, each fused metal layer has a structure composed of disk-like or layer-like particles called lamellae.

Then, this graphite sheet 11 is cut into a predetermined disk shape (e.g., disk shape with a diameter of 8 inches), and through-holes are formed at required position therein.

(11) Next, by using, for example, silicone resin, the attraction substrate 9 and the graphite sheet 11 are joined together (through the fused metal layer 23), and further the graphite sheet 11 and the first heater member 13 are joined together (through the fused metal layer 25). Further, by using, for example, silicone resin, the first heater member 13 and the metal base 5 are joined together as a single body. Thus, the electrostatic chuck 1 is completed.

d) Next, the effects of Embodiment 1 will be described.

In Embodiment 1, the graphite sheet 11 is disposed between the attraction substrate 9 and the first heater member 13. The graphite sheet 11 is an anisotropic heat conductor, the coefficient of thermal conductivity of which varies depending on directions, that is, an anisotropic heat conductor in which the coefficient of thermal conductivity in the plane direction is larger than the coefficient of thermal conductivity in the thickness direction.

Therefore, even when the heating state is uneven (depending on the position of the first heating element 21) due to the structure, arrangement, or the like of the first heating element 21 disposed in the first heater member 13, the graphite sheet 11 allows the temperature to be transferred easier in the plane direction than in the thickness direction. Accordingly, temperature unevenness in the plane direction is reduced, whereby temperature unevenness in the attraction substrate 9 (temperature unevenness at the substrate surface) can be reduced.

Since temperature unevenness in the semiconductor wafer 3 attracted to the attraction substrate 9 can be reduced as described above, it is possible to suppress a problem such as variation in the degree of processing in forming a pattern on the semiconductor wafer 3 by plasma etching, for example. As a result, the yield is improved when the semiconductor wafer 3 is processed.

Further, in Embodiment 1, the fused metal layers 23 and 25 formed of aluminum are disposed over the entirety of the upper surface 11a and the lower surface 11b of the graphite sheet 11, and the adhesive layers 27 and 29 formed of silicone resin are joined to the surfaces of the fused metal layers 23 and 25, respectively.

That is, although the graphite sheet 11 has poor wettability (i.e., joining performance) with silicone resin, since the fused metal layers 23 and 25 having enhanced joining performance with silicone resin are disposed at the surfaces of the graphite sheet 11 in Embodiment 1, the graphite sheet 11 disposed between the attraction substrate 9 and the first heater member 13 can be firmly joined thereto.

In particular, since the fused metal layers 23 and 25 are formed by spraying a melted metal onto the graphite sheet 11 by metal spraying and then solidifying the melted metal, the fused metal layers 23 and 25 are closely and firmly joined to the graphite sheet 11.

That is, since the graphite sheet 11 has the structure in which flaky thin films are stacked, the melted metal enters the gaps between the flaky thin films to be closely and firmly joined to the graphite sheet 11 in Embodiment 1. Therefore, joining performance between the graphite sheet 11 and the fused metal layers 23 and 25 is enhanced, whereby heat is quickly transferred from the graphite sheet 11 to the fused metal layers 23 and 25 as well as in the plane direction. Therefore, also in this point of view, temperature unevenness in the attraction substrate 9 can be significantly reduced. That is, the temperature at the substrate surface in the plane direction can be made more uniform.

Further, when the fused metal layers 23 and 25 are formed by coating or the like, the thickness thereof can be easily adjusted (i.e., can be easily increased). Accordingly, the fused metal layers 23 and 25 each having high thermal conductivity and the sufficient thickness spread in the plane direction, whereby temperature unevenness in the attraction substrate 9 can be reduced more significantly. That is, the temperature at the substrate surface can be made more uniform in the plane direction.

Further, since the fused metal layers 23 and 25 are firmly adhered to the graphite sheet 11, joining performance is high, and separation is less likely to occur between the fused metal layer 23, 25 and the graphite sheet 11, resulting in high durability.

Moreover, in Embodiment 1, since the adhesive layers 27, 29 and 31 each have a thermal expansion coefficient and a flexibility (Young's modulus) intermediate between those of alumina as a main component of the attraction substrate 9 and the first heater member 13 and those of graphite forming the graphite sheet 11, a thermal stress applied between the members adjacent to each adhesive layer 27, 29, 31 can be reduced. Accordingly, deformation (warpage) of the electrostatic chuck 1 due to the thermal stress can be suppressed.

e) Next, a modification of Embodiment 1 will be described.

Figure 7A:
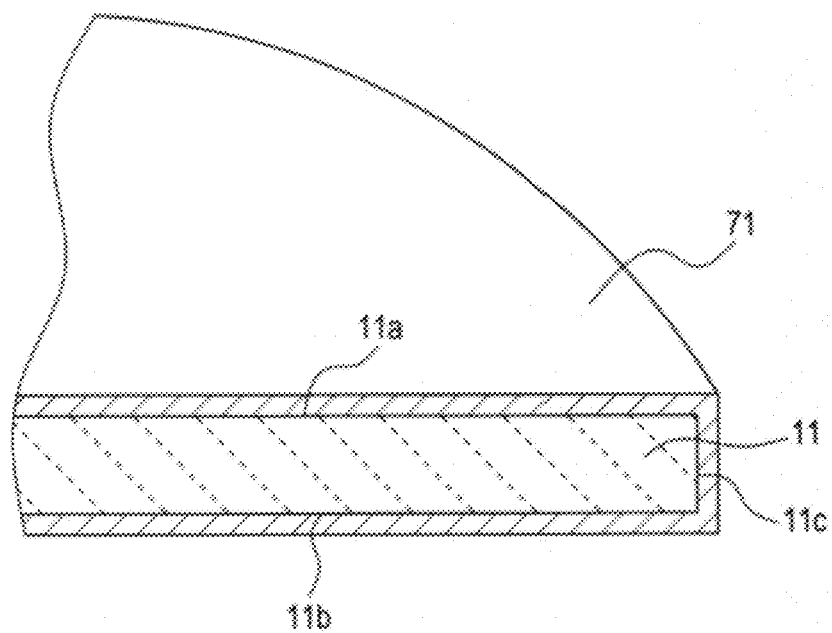
FIGS. 7A to 7B Perspective view illustrating a part of a graphite sheet and the like according to Modification 1 cut along the thickness direction thereof (FIG. 7A), and perspective view illustrating a part of a graphite sheet and the like according to Modification 2 cut along the thickness direction thereof (FIG. 7B).

In Modification 1, as shown in FIG. 7A, a fused metal layer 71 is formed over the entire surface of the graphite sheet 11.

As described above, since the graphite sheet 11 has the structure in which flaky thin films spreading in the plane direction are stacked, the thin films are likely to peel off at an end surface in the plane direction (a side surface 11c located between the upper surface 11a and the lower surface 11b). Therefore, depending on the state of use, the fused metal layers disposed on the upper surface 11a and the lower surface 11b of the graphite sheet 11 might be separated.

In contrast, since the fused metal layer 71 is formed so as to cover the entire surface of the graphite sheet 11 in Modification 1, the fused metal layer 71 is less likely to be separated.

Figure 7B:
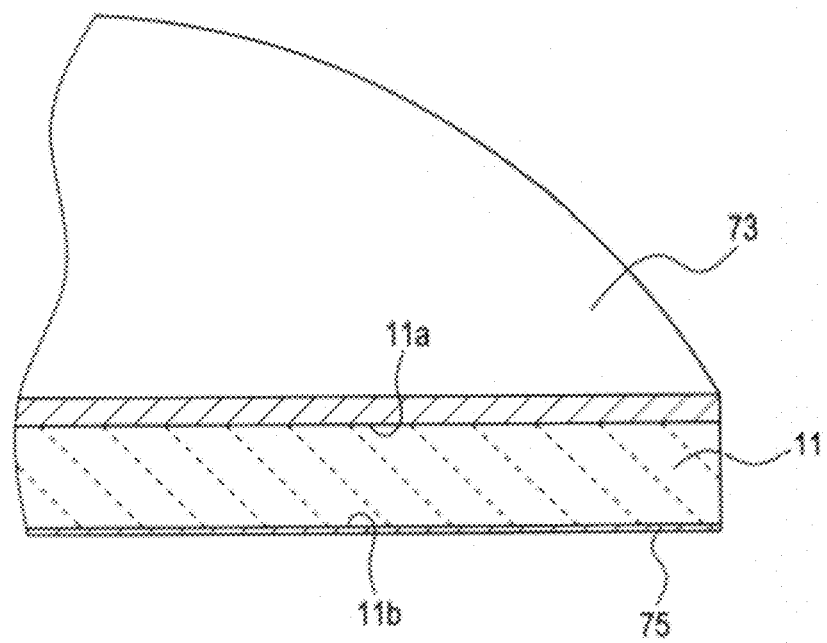

In Modification 2, as shown in FIG. 7B, a fused metal layer 73 similar to that of Embodiment 1 is formed so as to cover the entirety of one surface (e.g., the upper surface 11a) of the graphite sheet 11 in the stacking direction, while a plated metal layer 75 is formed by metal plating so as to cover the entirety of the other surface (e.g., the lower surface 11b). In the plated metal layer 75 thus formed, the above-mentioned lamella structure is not seen.

As an example of the metal plating, Ni plating may be adopted. The thickness of the metal plating may be in a range from 1 μm to 10 μm, for example, may be 3 μm.

Also in Modification 2, joining performance between the graphite sheet 11 and the other members (the attraction substrate 9 and the first heater member 13) can be enhanced. Accordingly, temperature unevenness of the attraction substrate 9 in the plane direction can be reduced.

Embodiment 2

Next, Embodiment 2 will be described. Description of components similar to those of Embodiment 1 will be omitted.

Embodiment 2 is greatly different from Embodiment 1 in that another heater member (hereinafter referred to as a second heater member) is disposed between the attraction substrate and the graphite sheet.

a) First, the schematic structure of the electrostatic chuck according to Embodiment 2 will be described.

Figure 8:
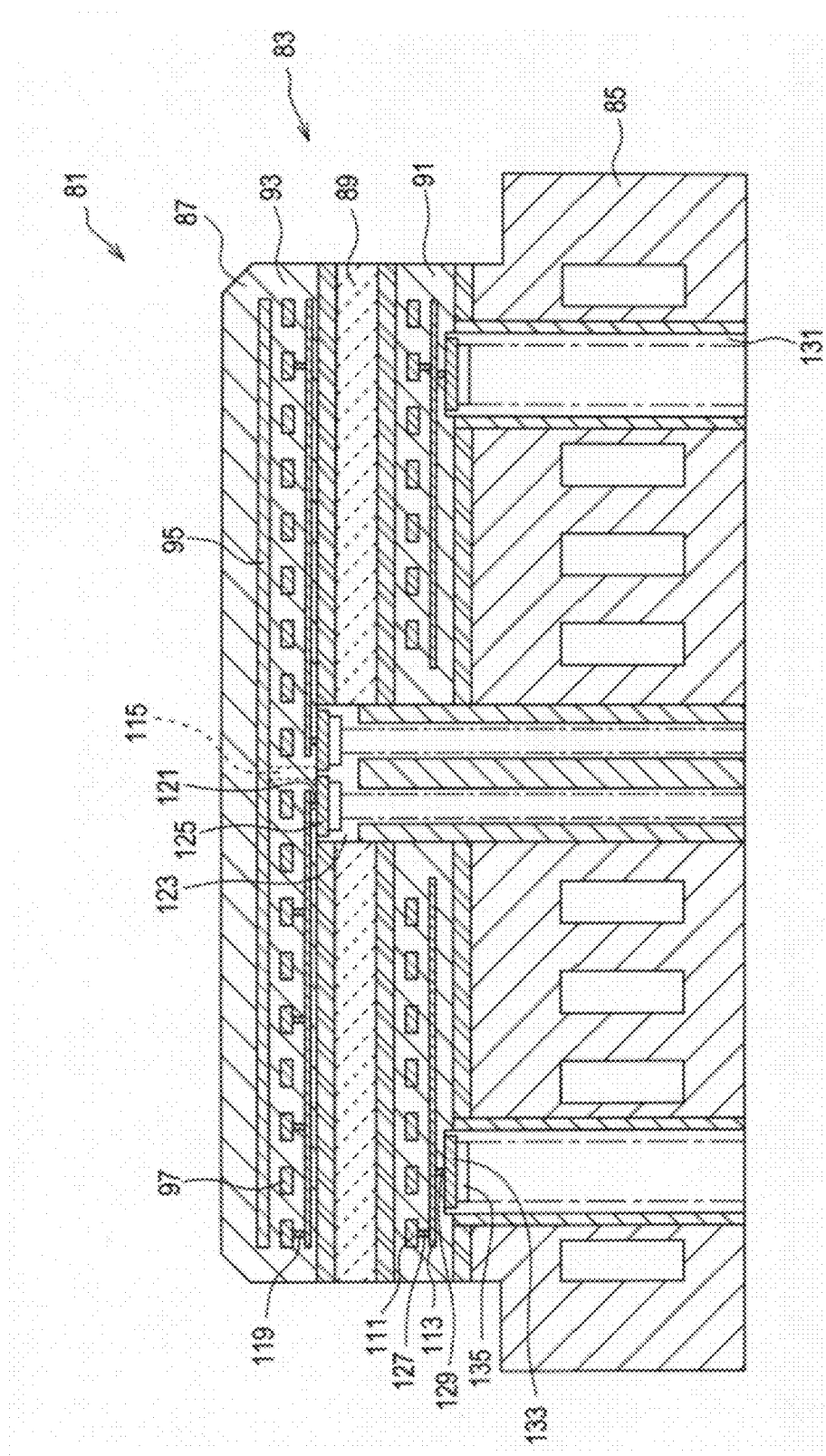
FIG. 8 Explanatory view schematically illustrating an electrostatic chuck according to Embodiment 2 cut along the thickness direction thereof.

As schematically shown in FIG. 8, the electrostatic chuck 81 according to Embodiment 2 includes an attraction member 83 and a metal base 85 as in Embodiment 1.

As in Embodiment 1, the attraction member 83 includes an attraction substrate 87, a graphite sheet 89 (anisotropic heat conductor), and a first heater member 91, and further includes a disk-like (in a plan view) second heater member 93 disposed between the attraction substrate 87 and the graphite sheet 89.

Figure 9:
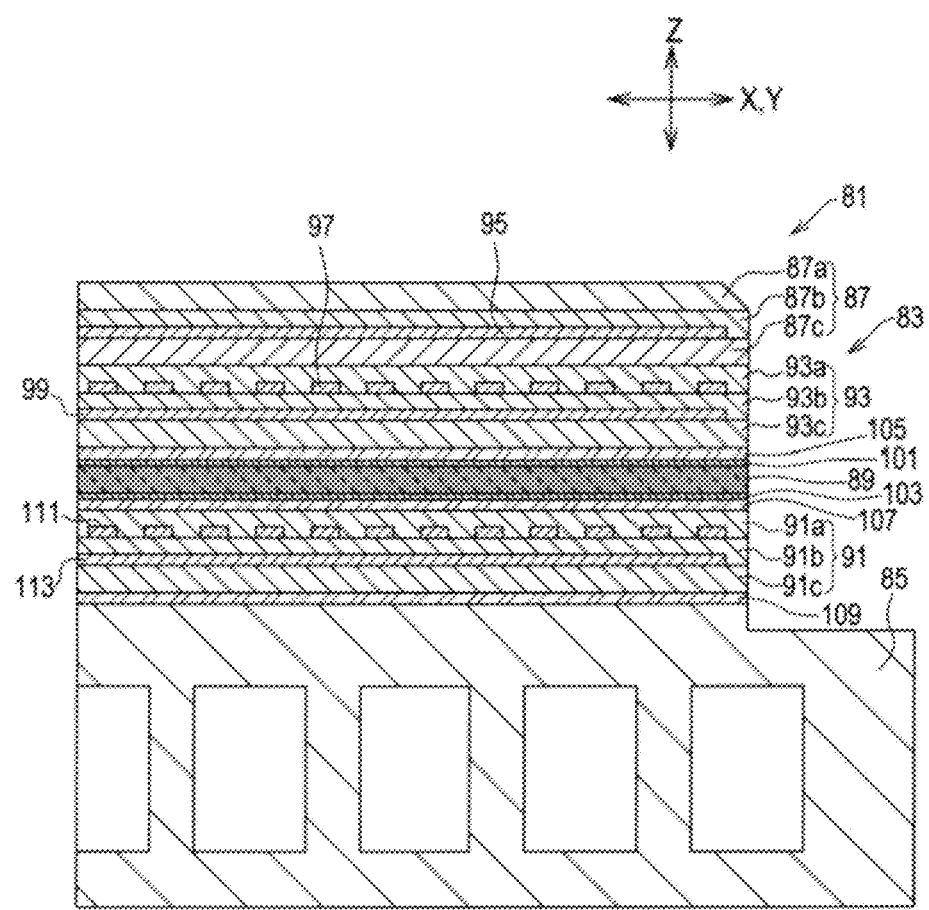
FIG. 9 Explanatory enlarged view illustrating a part of the electrostatic chuck according to Embodiment 2 cut along the thickness direction thereof.

Specifically, as shown in FIG. 9, the attraction substrate 87 is composed of three, i.e., first to third, ceramic layers 87a, 87b and 87c. An attraction electrode 95 (refer to FIG. 10A) is disposed between the second ceramic layer 87b and the third ceramic layer 87c as in Embodiment 1.

The second heater member 93 is composed of three, i.e., fourth to sixth, ceramic layers 93a, 93b and 93c. As described later, another heating element (hereinafter referred to as a second heating element) 97 (composed of four heating elements) (refer to FIG. 10B) is disposed between the fourth ceramic layer 93a and the fifth ceramic layer 93b. In addition, as described later, an internal conductive layer 99 divided into a plurality of regions (refer to FIG. 10D) is disposed between the fifth ceramic layer 93b and the sixth ceramic layer 93c.

At both sides of the graphite sheet 89 in the thickness direction (stacking direction), fused metal layers 101 and 103 similar to those of Embodiment 1 are disposed.

Between the one fused metal layer 101 and the second heater member 93 and between the other fused metal layer 103 and the first heater member 91, adhesive layers 105 and 107 similar to those of Embodiment 1 are disposed, respectively. Also between the first heater member 91 and the metal base 85, an adhesive layer 109 similar to that of Embodiment 1 is disposed.

The first heater member 91 is composed of three, i.e., seventh to ninth, ceramic layers 91a, 91b and 91c. As described later, a first heating element 111 (composed of two heating elements) (refer to FIG. 11A) is disposed between the seventh ceramic layer 91a and the eighth ceramic layer 91b. In addition, as described later, an internal conductive layer 113 divided into two regions (refer to FIG. 11C) is disposed between the eighth ceramic layer 91b and the ninth ceramic layer 91c.

b) Next, the electrical configuration of the electrostatic chuck 81 according to Embodiment 2 will be described.

[Attraction Electrode 95]

Figure 10A:
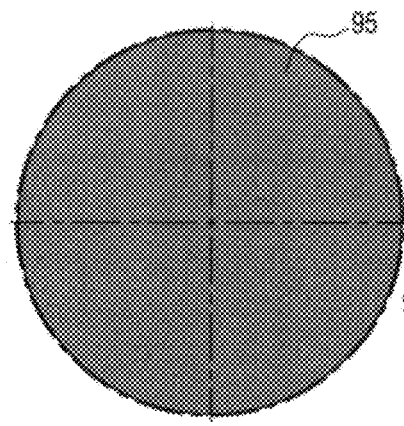
FIGS. 10A to 10E Plan view illustrating an attraction electrode (FIG. 10A), plan view illustrating a second heating element of a second heater member (FIG. 10B), plan view illustrating vias connected to the second heating element (FIG. 10C), plan view illustrating internal conductive layers (FIG. 10D), and plan view illustrating vias connected to the internal conductive layers (FIG. 10E).

As shown in FIG. 10A, the attraction electrode 95 has a circular shape in a plan view, as in Embodiment 1.

As shown in FIG. 8, on the rear side of the attraction electrode 95 (lower side in FIG. 8), an attraction conductive part 115 is formed along the vicinity of the central axis. In FIG. 8, however, only a part of the electrical configuration of the electrostatic chuck 1 is shown.

As in Embodiment 1, the attraction electrode 95 is connected to a metallization layer (not shown) exposed at an inner hole, through the attraction conductive part 115.

Further, although not shown, an internal connection terminal is disposed on the metallization layer, and a terminal metal fitting is attached to the internal connection terminal, whereby power for generating an electrostatic attraction force is supplied.

[Second Heater Member 93]

Figure 10B:
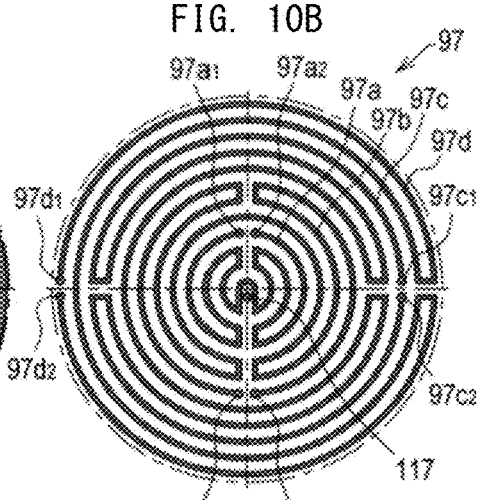

As shown in FIG. 10B, the second heating element 97 of the second heater member 93 is composed of (separated) four heating elements 97a, 97b, 97c and 97d surrounding the periphery of the central axis.

Specifically, the second heating element 97 includes: an A heating element 97a annularly arranged (to be partially folded back) at a position closest to the central axis in a plan view; a B heating element 97b annularly arranged (to be similarly partially folded back) on the outer peripheral side of the A heating element 97a; a C heating element 97c annularly arranged (to be similarly partially folded back) on the outer peripheral side of the B heating element 97b; and a D heating element 97d annularly arranged (to be similarly partially folded back) on the outer peripheral side of the C heating element 97c.

A central conductive layer 117 constituting a part of the attraction conductive part 115 is disposed substantially at the central axis (at a position slightly deviated from the central axis shown in FIG. 10B).

Figure 10C:
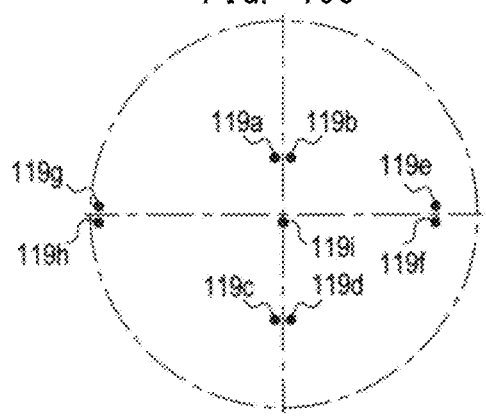
Figure 10D:
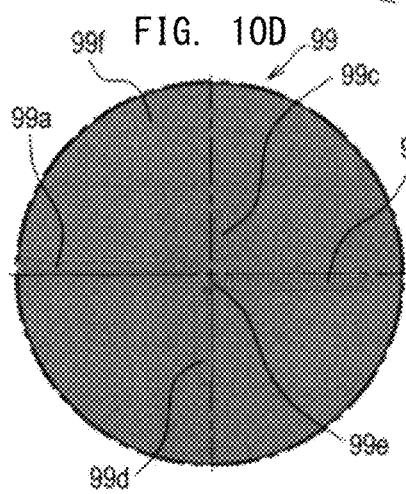

In addition, as shown in FIG. 10D, the internal conductive layer 99 is composed of electrically separated six regions.

Specifically, the internal conductive layer 99 includes: first and second conductive layers 99a and 99b each extending in a strip shape along the left-right direction in FIG. 10D; third and fourth conductive layers 99c and 99d each extending in a strip shape along the up-down direction in FIG. 10D; a fifth conductive layer 99e disposed at a position corresponding to the central conductive layer 117 in the stacking direction; and a sixth conductive layer 99f disposed to be electrically separated (with slight gaps) from the first to fifth conductive layers 99a to 99e. The planar shape of the sixth conductive layer 99f is a substantially circular shape which is similar to the planar shape of the attraction electrode 95.

The A to D heating elements 97a to 97d are electrically connected to the respective conductive layers 99a to 99d and 99f through the respective vias 119 (refer to FIG. 8).

That is, as shown in FIG. 10B, FIG. 10C and FIG. 10D, one terminal portion 97a1 of the A heating element 97a is connected to the sixth conductive layer 99f through the first via 119a, while the other terminal portion 97a2 thereof is connected to the third conductive layer 99c through the second via 119b. One terminal portion 97b1 of the B heating element 97b is connected to the fourth conductive layer 99d through the third via 119c, while the other terminal portion 97b2 thereof is connected to the sixth conductive layer 99f through the fourth via 119d. One terminal portion 97c1 of the C heating element 97c is connected to the sixth conductive layer 99f through the fifth via 119e, while the other terminal portion 97c2 thereof is connected to the second conductive layer 99b through the sixth via 119f. One terminal portion 97d1 of the D heating element 97d is connected to the first conductive layer 99a through the seventh via 119g, while the other terminal portion 97d2 thereof is connected to the sixth conductive layer 99f via the eighth via 119h. The central conductive layer 117 is connected to the fifth conductive layer 99e through the ninth via 119i.

Further, the respective conductive layers 99a to 99f are connected to the vias 121 (refer to FIG. 8).

Figure 10E:
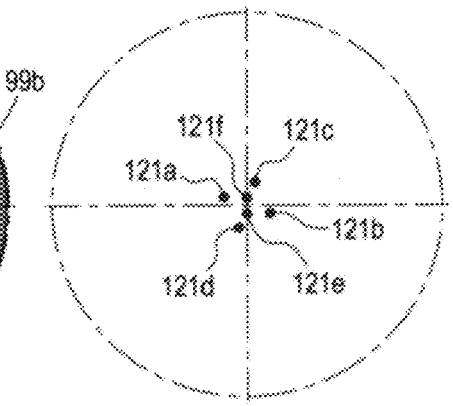

Specifically, as shown in FIG. 10D and FIG. 10E, the first conductive layer 99a is connected to the first via 121a, the second conductive layer 99b is connected to the second via 121b, the third conductive layer 99c is connected to the third via 121c, the fourth conductive layer 99d is connected to the fourth via 121d, the fifth conductive layer 99e is connected to the fifth via 121e (which forms a part of the attraction conductive part 115), and the sixth conductive layer 99f is connected to the sixth via 121f.

As shown in FIG. 8, each via 121 is connected to a metallization layer 125 exposed at an inner hole 123, and an internal connection terminal 127 is formed on the metallization layer 125. In FIG. 8, some of the metallization layers 125 and the internal connection terminals 127 are shown.

[First Heater Member 91]

Figure 11A:
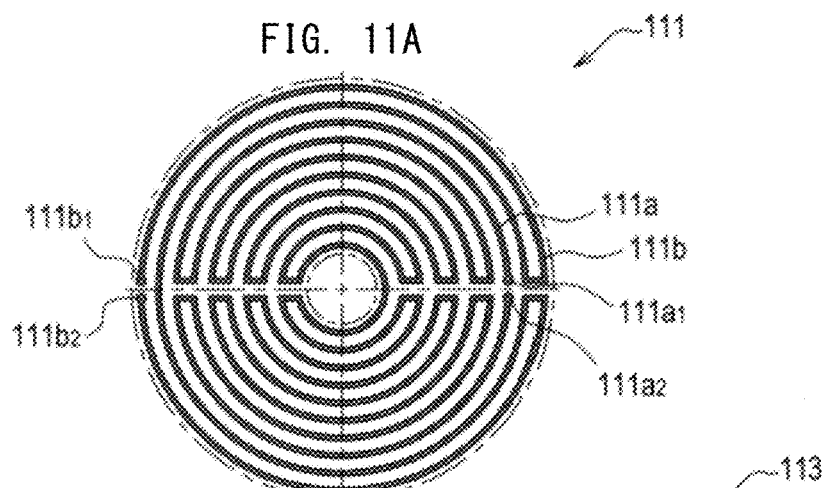
FIGS. 11A to 11D Plan view illustrating a first heating element as a part of a first heater member (FIG. 11A), plan view illustrating vias connected to the first heating element (FIG. 11B), plan view illustrating internal conductive layers (FIG. 11C), and plan view illustrating vias connected to the internal conductive layers (FIG. 11D).

As shown in FIG. 11A, the first heating element 111 of the first heater member 91 is composed of two (separated) heating elements 111a and 111b, each surrounding the periphery of the central axis.

Specifically, the first heating element 111 includes: an E heating element 111a annularly arranged (to be partially folded back) at a position closest to the central axis in a plan view; and an F heating element 111b annularly arranged (to be similarly partially folded back) on the outer peripheral side of the E heating element 111a.

Figure 11B:
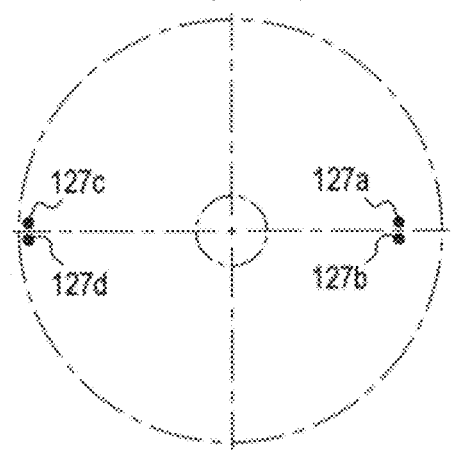
Figure 11C:
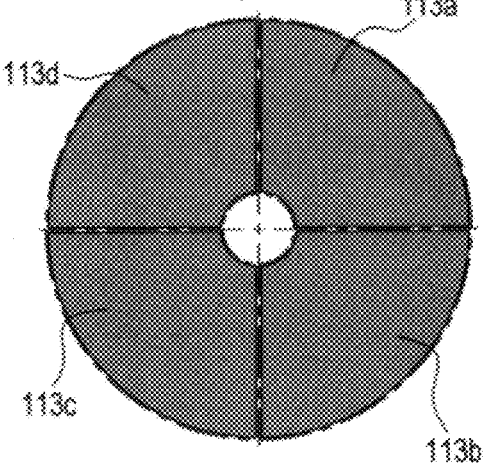

Further, as shown in FIG. 11C, the internal conductive layer 113 is composed of electrically separated four regions.

Specifically, the internal conductive layer 113 is composed of fan-like first to fourth conductive layers 113a to 113d obtained by dividing a circle with a central angle of 90° in a plan view.

The E and F heating elements 111a and 111b are electrically connected to each of the internal conductive layers 113a to 113d through each via 129 (refer to FIG. 8).

That is, as shown in FIG. 11A, FIG. 11B and FIG. 11C, one terminal portion 111a1 of the E heating element 111a is connected to the first conductive layer 113a through a first via 127a, while the other terminal portion 111a2 thereof is connected to the second conductive layer 113b through a second via 127b. One terminal portion 111b1 of the F heating element 111b is connected to the fourth conductive layer 113d through a third via 127c, while the other terminal portion 111b2 is connected to the third conductive layer 113c through a fourth via 119d.

Further, the respective internal conductive layers 113a to 113d are connected to the via 129 (refer to FIG. 8).

Figure 11D:
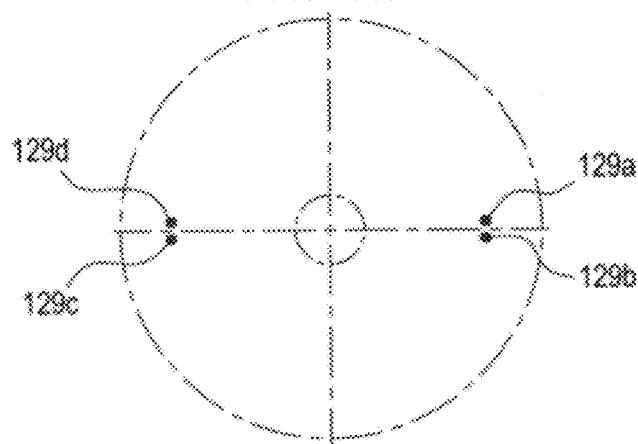

Specifically, as shown in FIG. 11C and FIG. 11D, the first conductive layer 113a is connected to a first via 129a, the second conductive layer 113b is connected to a second via 129b, the third conductive layer 113c is connected to a third via 129c, and the fourth conductive layer 113d is connected to a fourth via 129d.

As shown in FIG. 8, each via 129 is connected to a metallization layer 133 exposed at an inner hole 131, and an internal connection terminal 135 is formed on the metallization layer 133. In FIG. 8, some of the metallization layers 133 and the internal connection terminals 135 are shown.

c) Next, the operation of the electrostatic chuck according to Embodiment 2 will be described.

When attracting the semiconductor wafer 3, a predetermined voltage is applied to the attraction electrode 95 through the terminal metal fitting, the internal connection terminal, the attraction conductive part 115, and the like. Thus, an electrostatic attraction force is generated in the attraction electrode 95 to attract the semiconductor wafer 3.

When heating the attraction substrate 87 (consequently, the semiconductor wafer 3), the first heater member 91 is used, for example. The second heater member 93 may be simultaneously used.

In particular, when it is desired to control the temperature at the center side of the attraction substrate 87 and the temperature at the outer peripheral side thereof independently from each other, a power applied to the E heating element 111a in the first heating element 111 and a power applied to the F heating element 111b in the first heating element 111 are individually (independently) controlled. Thus, the temperature at the center side of the attraction substrate 87 and the temperature at the outer peripheral side thereof can be independently controlled.

For example, in the case where a difference in temperature occurs between the center side of the attraction substrate 87 and the outer peripheral side thereof even when the graphite sheet 89 including the fused metal layers 101 and 103 is used, a power applied to the E heating element 111a and a power applied to the F heating element 111b can be individually (independently) controlled so that the temperature at the center side of the attraction substrate 87 and the temperature at the outer peripheral side thereof are equal to each other.

Specifically, using a pair of metal terminals, a predetermined voltage is applied to the pair of terminal portions 111a1 and 111a2 of the E heating element 111a through the pair of internal connection terminals, the pair of metallization layers, the pair of vias 129a and 129b, and the pair of internal conductive layers 113a and 113b.

Likewise, using a pair of metal terminals, a predetermined voltage is applied to the pair of terminal portion 111b1 and 111b2 of the F heating element 111b through the pair of the internal connection terminals, the pair of the metallization layers, the pair of vias 129c and 129d, and the pair of internal conductive layers 113c and 113d.

Accordingly, by applying the different voltages to the E and F heating elements 111a and 111b, the temperature of the attraction substrate 87 can be freely controlled at each of the center side and the outer peripheral side of the attraction substrate 87.

Further, when it is desired to change the temperature at the center side of the attraction substrate 87 from the temperature at the outer peripheral side thereof more precisely, voltages applied to the A to D heating elements 97a, 97b, 97c and 97d in the second heating element 97 are individually (independently) controlled. Thus, the temperature at the center side of the attraction substrate 87 and the temperature at the outer peripheral side thereof can be precisely controlled within a narrower range.

Specifically, as shown in FIGS. 10A to 10E, when the temperatures of the A to D heating elements 97a to 97d of the second heating element 97 are individually controlled in the second heater member 93, the sixth conductive layer 99f is used as a common electrode. Then, voltages applied between the common sixth conductive layer 99f and the other first to fourth conductive layers 99a to 99d are controlled to control the temperatures of the A to D heating elements 97a to 97d.

Specifically, a voltage applied between the sixth conductive layer 99f and the first conductive layer 99a, a voltage applied between the sixth conductive layer 99f and the second conductive layer 99b, a voltage applied between the sixth conductive layer 99f and the third conductive layer 99c, and a voltage applied between the sixth conductive layer 99f and the fourth conductive layer 99d are independently controlled by using a power supply circuit or the like (not shown).

Thus, different voltages are applied to the A to D heating elements 97a to 97d, whereby the temperatures in the four regions from the center side of the attraction substrate 87 to the outer peripheral side thereof can be freely controlled.

d) Next, the effects of the electrostatic chuck 81 according to Embodiment 2 will be described.

In Embodiment 2, as in Embodiment 1, it is possible to make the temperature of the attraction substrate 87 (consequently, the semiconductor wafer 3) in the plane direction uniform.

Further, Embodiment 2 is also effective in the case where the temperature of the attraction substrate 87 (consequently, the attraction object member) in the plane direction is desired to be arbitrarily controlled according to positions, depending on, for example, the content of processing on the attraction object member such as the semiconductor wafer 3.

In Embodiment 2, the second heater member 93 is disposed between the attraction substrate 87 and the graphite sheet 89, in addition to the first heater member 91. Moreover, the second heating element 97 of the second heater member 93 is composed of a plurality of heating elements (A to D heating elements 97a to 97d) separately disposed at different positions in the plane direction so that the temperature of the attraction substrate 87 can be controlled to different temperatures depending on the positions in the plane direction. Therefore, by controlling the temperatures of the plurality of heating elements to desired temperatures, the temperature of the attraction substrate 87 can be controlled to different temperatures depending on the positions in the plane direction.

That is, by controlling the temperatures of the separated A to D heating elements 97a to 97d, the temperature of the semiconductor wafer 3 can be easily controlled to desired temperatures.

Furthermore, in Embodiment 2, the first heating element 111 of the first heater member 91 is also composed of a plurality of heating elements (E and F heating elements 111a and 111b).

Thus, Embodiment 2 can be appropriately applied to the case where the temperature of the attraction substrate 87 is desired to be controlled to the same temperature in the plane direction (where the temperature thereof in the plane direction is desired to be uniform).

That is, in the case where a difference in temperature occurs between the center side of the attraction substrate 87 and the outer peripheral side thereof when the temperature of the attraction substrate 87 is desired to be controlled to the same temperature in the plane direction, the power applied to the E heating element 111a and the power applied to the F heating element 111b can be individually (independently) controlled so that the temperature at the center side of the attraction substrate 87 and the temperature at the outer peripheral side thereof are equal to each other. Thus, the temperature of the attraction substrate 87 in the plane direction can be easily made uniform.

Accordingly, in Embodiment 2, it is possible to achieve a remarkable effect that the temperature of the attraction substrate 87 can be controlled to different temperatures depending on positions in the plane direction, and also can be controlled to the same temperature in the plane direction.

Particularly in Embodiment 2, the number of the heating elements 97a to 97d separately disposed in the second heating element 97 is larger than the number of the heating elements 111a and 111b separately disposed in the first heating element 111. Therefore, by controlling the temperatures of the plurality of heating elements 97a to 97d of the second heating element 97 to desired temperatures, the temperature of the attraction substrate 87 can be easily and precisely controlled so that different temperature gradients are generated depending on the positions in the plane direction.

In contrast, even when the number of the heating elements separately disposed in the first heating element 111 is larger than the number of the heating elements separately disposed in the second heating element 97 and the temperatures of the heating elements 111a and 111b are controlled to desired temperatures, a difference in temperature in the plane direction is reduced due to the effect of the graphite sheet 89, and therefore, it is difficult to allow the attraction substrate 87 to have desired different temperature gradients depending on the positions in the plane direction.

Accordingly, by controlling the temperatures of the above-mentioned plurality of heating elements to desired temperatures, the temperature of the attraction substrate 87 can be appropriately controlled to desired temperatures depending on the positions in the plane direction.

The present invention is not limited to the above embodiments or the like at all, and needless to say, can be carried out in various modes without deviating from the scope of the present invention.

(1) For example, the structure of the metal layer (fused metal layer or plated metal layer) that covers the surface of the graphite sheet according to Embodiment 1 and its modification can be applied to the electrostatic chuck according to Embodiment 2.

For example, even in the case where the structure of the metal layer (fused metal layer or plated metal layer) that covers the surface of the graphite sheet according to Embodiment 1 or the like is used, uniformity of the temperature of the attraction substrate might be desired more strictly when making the temperature of the attraction substrate uniform. In this situation, the temperatures of the plurality of heating elements of the first heater member are controlled in accordance with a temperature difference that occurs in the attraction substrate, whereby the temperature of the attraction substrate (semiconductor wafer) in the plane direction can be made uniform more effectively. Further, when it is desired to arbitrarily control the temperature of the attraction substrate in the plane direction depending on positions, it is possible to control the temperature of the attraction substrate to different temperatures depending on the positions in the plane direction, by controlling the second heater member. Accordingly, a temperature difference in the plane direction can be generated more easily by merely controlling the second heater member, and the temperature difference can be estimated based on the amount of power applied to the second heater member.

(2) the structure of the first heater member (i.e., multiple heating elements) or the second heater member (i.e., multiple heating elements) according to Embodiment 2 may be applied to the electrostatic chuck according to Embodiment 1.

For example, regarding Embodiment 1, the structure of the metal layer (fused metal layer or plated metal layer) that covers the surface of the graphite sheet increases the adherence between the graphite sheet and the metal layer and the adherence between the metal layer and the adhesive layer, whereby heat transfer in the first heater member (single heating element) can be made uniform within the plane. At this time, by providing the second heater member of the Embodiment 2, the temperature of the attraction substrate can be easily controlled so that different temperature gradients are generated depending on the positions in the plane direction. Accordingly, a temperature difference in the plane direction can be generated more easily by merely controlling the second heater member, and the temperature difference can be estimated based on the amount of power applied to the second heater member.

Alternatively, the structure of the first heater member (i.e., single heating element) according to Embodiment 1 may be applied to the electrostatic chuck according to Embodiment 2.

What is claimed is:

1. An electrostatic chuck comprising:
   an attraction substrate having a first main surface and a second main surface, and having an attraction electrode; and
   a heater member disposed on a side where the second main surface is present, and including a heating element that heats the attraction substrate,
   the electrostatic chuck causing an attraction object to be attracted to the first main surface, by using an electrostatic attraction force generated when a voltage is applied to the attraction electrode, wherein
   an anisotropic heat conductor is disposed between the attraction substrate and the heater member, the anisotropic heat conductor having an upper surface and a lower surface, and a coefficient of thermal conductivity which varies depending on directions,
   the anisotropic heat conductor is disposed so that the coefficient of thermal conductivity in a plane direction is larger than the coefficient of thermal conductivity in a thickness direction,
   metal layers are provided which are joined to the anisotropic heat conductor so as to cover the upper surface and the lower surface of the anisotropic heat conductor,
   an adhesive layer is provided on a surface of each metal layer, the adhesive layer joining the metal layer to the attraction substrate or the heater member, and
   at least one of the metal layers is a fused metal layer formed by solidifying a melted metal.

2. The electrostatic chuck according to claim 1, including a second fused metal layer formed by solidifying a melted metal, the second fused metal layer covering a side surface located between the upper surface and the lower surface of the anisotropic heat conductor.

3. The electrostatic chuck according to claim 1, wherein the fused metal layer is a sprayed metal layer formed by metal spraying.

4. The electrostatic chuck according to claim 1, including:
   another heater member disposed between the attraction substrate and the adhesive layer at the upper surface side of the anisotropic heat conductor, the another heater member including another heating element that heats the attraction substrate, wherein
   the another heating element of the another heater member is configured to include a plurality of heating elements separately disposed at different positions in the plane direction so that a temperature of the attraction substrate can be controlled to different temperatures depending on the positions in the plane direction.

5. The electrostatic chuck according to claim 1, wherein each heater member, except each heating element, is formed of ceramic or polyimide as a main component.

6. The electrostatic chuck according to claim 1, wherein the anisotropic heat conductor is formed of graphite.

7. The electrostatic chuck according to claim 1, wherein the metal layer is at least one of aluminum (Al), nickel (Ni), gold (Au), or an alloy thereof.

8. An electrostatic chuck comprising:
- an attraction substrate having a first main surface and a second main surface, and having an attraction electrode; and
- a heater member disposed on a side where the second main surface is present, and including a heating element that heats the attraction substrate,
- the electrostatic chuck causing an attraction object to be attracted to the first main surface, by using an electrostatic attraction force generated when a voltage is applied to the attraction electrode, wherein
- an anisotropic heat conductor is disposed between the attraction substrate and the heater member, the anisotropic heat conductor having an upper surface and a lower surface, and a coefficient of thermal conductivity which varies depending on directions,
- the anisotropic heat conductor is disposed so that the coefficient of thermal conductivity in a plane direction is larger than the coefficient of thermal conductivity in a thickness direction,
- another heater member is provided between the attraction substrate and the anisotropic heat conductor, the another heater member including another heating element that heats the attraction substrate, and
- the another heating element of the another heater member is configured to include a plurality of heating elements separately disposed at different positions in the plane direction so that a temperature of the attraction substrate can be controlled to be different temperatures depending on the positions in the plane direction.

9. The electrostatic chuck according to claim 8, including:
- metal layers which are joined to the anisotropic heat conductor so as to cover the upper surface and the lower surface of the anisotropic heat conductor; and
- an adhesive layer disposed on a surface of each metal layer, the adhesive layer joining the metal layer to the heater member or the another heater member.

10. The electrostatic chuck according to claim 8, wherein the heating element of the heater member is composed of a plurality of heating elements separately disposed at different positions in the plane direction, and
the number of the heating elements separately disposed in the another heating element is larger than the number of the heating elements separately disposed in the heating element.

11. The electrostatic chuck according to claim 8, wherein each heater member, except each heating element, is formed of ceramic or polyimide as a main component.

12. The electrostatic chuck according to claim 8, wherein the anisotropic heat conductor is formed of graphite.

* * * * *